US006738253B2

(12) United States Patent
Beuille et al.

(10) Patent No.: US 6,738,253 B2
(45) Date of Patent: May 18, 2004

(54) ELECTRONIC POWER MODULE AND A POWER COMPONENT DESIGNED TO EQUIP SUCH A MODULE

(75) Inventors: Chritophe Beuille, Impasse René Char (FR); Fabrice Breit, Plateau la Laurence (FR)

(73) Assignee: Alstom, Paris (FR)

( * ) Notice: Subject to any disclaimer, the term of this patent is extended or adjusted under 35 U.S.C. 154(b) by 45 days.

(21) Appl. No.: 10/173,879

(22) Filed: Jun. 19, 2002

(65) Prior Publication Data

US 2002/0196610 A1 Dec. 26, 2002

(30) Foreign Application Priority Data

Jun. 20, 2001 (FR) .............................. 01 08099

(51) Int. Cl.[7] ................................. H05K 5/00
(52) U.S. Cl. ....................... 361/679; 361/752; 257/678; 29/830
(58) Field of Search ................ 361/679–687, 361/724–727; 257/678, 685–687; 438/106, 112, 118, 127; 29/841, 855, 830

(56) References Cited

U.S. PATENT DOCUMENTS 5,146,314 A   9/1992  Pankove
5,606,201 A   2/1997  Lutz
5,923,086 A   7/1999  Winer et al.
6,573,592 B2 * 6/2003  Bolken ........................ 257/687

FOREIGN PATENT DOCUMENTS

EP  0 637 078 A   2/1995
EP  0 645 816 A   3/1995
EP  0 814 509 A   12/1997

OTHER PUBLICATIONS

Patent Abstracts of Japan, vol. 2000, No. 23, Feb. 10, 2001 & JP 2001 168256 A (Sumitomo Electric Ind Ltd), Jun. 22, 2001, (abstract).

* cited by examiner

Primary Examiner—Hung Van Duong
(74) Attorney, Agent, or Firm—Sughrue Mion, PLLC

(57) ABSTRACT

An electronic power module including at least one semi-conductor power component disposed on an electrically insulating substrate, wherein said semi-conductor power component includes a face in contact with said substrate, which face is metallized in part and is covered in part in a diamond layer, said metallized portion being in contact with a conductor track provided on the surface of the substrate, and said diamond-covered portion being in register with an opening formed in the substrate, said substrate including a face remote from the semi-conductor component which is cooled by a liquid coolant, said liquid flowing into said opening and over the surface of the diamond-covered portion.

8 Claims, 1 Drawing Sheet

ELECTRONIC POWER MODULE AND A POWER COMPONENT DESIGNED TO EQUIP SUCH A MODULE

The invention relates to an electronic power module including at least one power module disposed on an electrically insulating substrate, and to a semi-conductor power component designed to equip such a substrate. The electronic power module of the invention is particularly intended to be used for mounting insulated grid bipolar transistors (IGBTS) in power distribution circuits of the railway industry.

BACKGROUND OF THE INVENTION

It is known that the performance of electronic power modules is limited by the temperature reached by the electronic power components in operation. For example, beyond 150° C., the performance of a silicon chip is significantly degraded. As a result, it is very important to evacuate effectively the heat dissipated by the Joule effect, so as to maintain an optimum operating temperature in the components, and thus be able to increase the usable power or the reliability of the system.

In general, electronic power modules designed for railway traction are constituted by a power component soldered onto a substrate comprising an electrically insulating wafer made of aluminum nitrate AlN that is covered on its bottom and top faces by copper metallization using a method known as direct bonding copper (DBC), the substrate being cooled by a radiator in contact with the bottom layer of copper. However, such electronic modules present the drawback of having bonding layers at the solders and the metallizations which constitute thermal barriers, considerably reducing capacity to transmit heat through the substrate, thereby limiting the dissipation of energy through the cooling radiator.

OBJECT AND SUMMARY OF THE INVENTION

The object of the present invention is thus to propose an electronic power module which remedies those drawbacks while ensuring excellent cooling of the power components.

To this end, the invention provides an electronic power module including at least one semi-conductor power component disposed on an electrically insulating substrate, wherein the semi-conductor power component includes a face in contact with the substrate, which face is metallized in part and is covered in part in a diamond layer, the metallized portion being in contact with a conductor track provided on the surface of the substrate, and the diamond-covered portion being in register with an opening formed in the substrate, said substrate including a face remote from the semi-conductor component which is cooled by a liquid coolant, the liquid coolant flowing into the opening and over the surface of the diamond-covered portion.

In particular embodiments, the electronic power module can comprise one or more of the following characteristics taken in isolation, or in any technically feasible combination:

- the face of the semi-conductor power component in contact with the substrate is metallized at its periphery and covered in a diamond layer over the rest of its surface;
- the diamond layer is deposited on the semi-conductor power component by chemical vapor deposition (CVD);
- the diamond layer covering the semi-conductor power component forms excess thickness which is inserted into the opening of the substrate, said opening having a shape that is complementary to the shape of the diamond layer;
- the semi-conductor power component is an IGBT component; and
- the substrate is made of aluminum nitrate AlN or aluminum.

The invention also provides a semi-conductor power component designed to equip such an electronic power module, the component including a face designed to contact a substrate, which face is metallized in part and is covered in part in a diamond layer.

According to another characteristic of the semi-conductor power component of the invention, the face is metallized at its periphery and covered in a diamond layer over the rest of its surface.

BRIEF DESCRIPTION OF THE DRAWING

The objects, characteristics, and advantages of the present invention will be better understood on reading the following description of an embodiment of the invention, given as non-limiting example, and with reference to the accompanying drawing, in which.

MORE DETAILED DESCRIPTION

Figure 1:
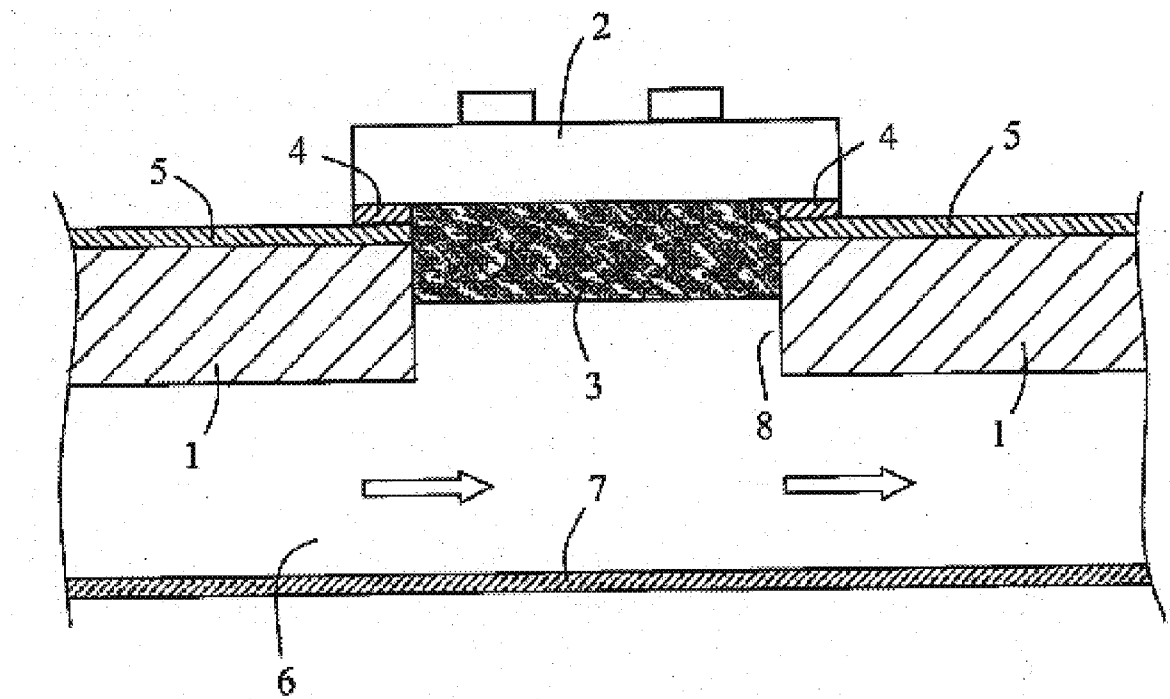
FIG. 1 is a diagrammatic section view of an embodiment of the electronic power module of the invention.

To make the drawing easier to understand, only those elements that are necessary for understanding the invention are shown.

FIG. 1 shows an electronic power module including a semi-conductor power component 2, such as an IGBT component, disposed on a substrate 1 made of aluminum nitrate AlN or aluminum.

Figure 2:
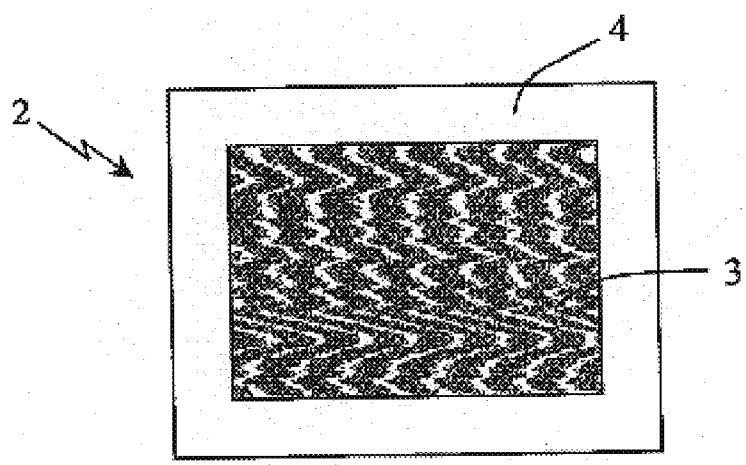
FIG. 2 is a diagrammatic view from below of the power component equipping the power module of FIG. 1.

The IGBT component 2, shown diagrammatically in FIG. 2, has a bottom face which is provided at its periphery with a conductor track 4 constituting a collector and which is covered in its center by a diamond layer 3 of rectangular shape. In conventional manner, the IGBT component 2 also has a control connection and an emitter on its top face. The diamond layer 3 which covers the entire bottom face of the IGBT component, except for the portion reserved for the conductor track, is obtained in manner known per se by chemical vapor deposition (CVD) on the silicon face of the component 2 to a thickness of about 150 micrometers ($\mu$m), the conductor track 4 being made by metallizing the periphery of the face of the component 2 through a mask to a thickness of about 5 $\mu$m.

In FIG. 1, the IGBT component 2 contacts the substrate 1, thereby bringing the conductor track 4 into contact with a copper conductor track 5 supported by the substrate 1, and thereby inserting the excess thickness of the diamond layer 3 into an opening 8 of complementary shape formed in the substrate 1. The opening 8 passes through the substrate 1 and opens out to the bottom face of the substrate 1 which is swept by a liquid coolant 6 channeled by the wall 7 of a cooling housing.

The power module made in this way has an IGBT component having a bottom face whose main portion is cooled by conduction through the diamond layer which is in contact with the liquid coolant thus making it possible, because of the excellent thermal conductivity of the diamond layer of about 1500 watts per meter per kelvin (W/m.K) to 2000 W/m.K, to evacuate significant amounts of heat energy into the liquid coolant, while also ensuring good electrical insulation between the liquid coolant and the power component because of the dielectric properties of diamond. In addition, such a power module has the advantage of being used with vertical-technology components, where electrical current passes through a component by the semi-conductor power component being connected via the periphery of its bottom face.

The electronic power module of the invention thus ensures optimum cooling of the semi-conductor power component, thereby enabling higher-voltage or higher-current IGBT components to be used, and thereby enabling the number of components required to make a power converter in a traction system of a railway vehicle to be reduced.

Naturally, the invention is not limited to the embodiment described and shown which has been given solely by way of example. Modifications are possible, in particular from the point of view of the constitution of the various elements, or by substitution of technical equivalents, without going beyond the field protected by the invention.

Thus, in variant embodiments not shown, the shape of the conductor track and of the diamond layer could be varied, and they could be positioned differently on the bottom face of the semi-conductor power component.

We claim:

1. An electronic power module including at least one semi-conductor power component disposed on an electrically insulating substrate, wherein said semi-conductor power component includes a face in contact with said substrate, which face is metallized in part and is covered in part in a diamond layer, the metallized part of the face being in contact with a conductor track provided on a surface of the substrate, and the diamond layer being in register with an opening formed in the substrate, said substrate including a face remote from the semi-conductor power component which is cooled by a liquid coolant, said liquid coolant flowing into said opening and over a surface of the diamond layer.

2. An electronic power module according to claim 1, wherein the face of the semi-conductor power component in contact with the substrate is metallized at its periphery and covered in the diamond layer over the rest of its surface.

3. An electronic power module according to claim 1, wherein said diamond layer is deposited on the semi-conductor power component by chemical vapor deposition.

4. An electronic power module according to claim 1, wherein the diamond layer covering the semi-conductor power component forms excess thickness which is inserted into the opening of the substrate, said opening having a shape that is complementary to the shape of the diamond layer.

5. An electronic power module according to claim 1, wherein the semi-conductor power component is an IGBT component.

6. An electronic power module according to claim 1, wherein said substrate is made of aluminum nitrate AlN or aluminum.

7. A semi-conductor power component designed to equip a power module having a surface in which an opening is formed, liquid coolant flowing beneath the surface across the opening, and the surface being further provided with a conductor track, wherein the semi-conductor power component comprises:

a face which is metallized at its periphery and covered in a diamond layer over the rest of its surfaces, wherein the metallized periphery of said face is configured to contact the conductor track on the surface of the power module, and wherein the diamond layer is configured to be in register with the opening in the surface of the power module so that a surface of the diamond layer is cooled by the liquid coolant.

8. A semi-conductor power component according to claim 7, wherein said semi-conductor rower component is an IGBT component.

* * * * *